United States Patent
Lee et al.

(10) Patent No.: US 9,998,078 B2
(45) Date of Patent: Jun. 12, 2018

(54) ELECTRONIC DEVICE AND METHOD FOR SWITCHING POWER AMPLIFIERS

(71) Applicant: Samsung Electronics Co., Ltd., Gyeonggi-do (KR)

(72) Inventors: Dong-Ju Lee, Daegu (KR); Ji-Woo Lee, Gyeongsangbuk-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 425 days.

(21) Appl. No.: 14/539,769

(22) Filed: Nov. 12, 2014

(65) Prior Publication Data

US 2015/0133103 A1    May 14, 2015

(30) Foreign Application Priority Data

Nov. 12, 2013  (KR) .................. 10-2013-0136948

(51) Int. Cl.
| | |
|---|---|
| *H03F 3/04* | (2006.01) |
| *H03F 1/52* | (2006.01) |
| *H04W 52/02* | (2009.01) |
| *H03F 3/24* | (2006.01) |
| *H03F 3/72* | (2006.01) |

(Continued)

(52) U.S. Cl.
CPC ............. *H03F 1/526* (2013.01); *G06F 1/206* (2013.01); *H03F 3/24* (2013.01); *H03F 3/72* (2013.01); *H04W 52/0254* (2013.01); *H03F 1/0288* (2013.01); *H03F 1/30* (2013.01); *H03F 1/301* (2013.01); *H03F 1/302* (2013.01); *H03F 3/04* (2013.01); *H03F 3/211* (2013.01); *H03F 2200/447* (2013.01); *H03F 2200/468* (2013.01); *H03F 2203/7215* (2013.01); *H03F 2203/7221* (2013.01); *H03F 2203/7236* (2013.01); *H04M 1/72569* (2013.01); *H04M 2250/12* (2013.01); *H04M 2250/22* (2013.01); *Y02D 70/00* (2018.01); *Y02D 70/142* (2018.01); *Y02D 70/144* (2018.01); *Y02D 70/166* (2018.01)

(58) Field of Classification Search
CPC ... H03F 1/526; H03F 3/24; H03F 3/72; H03F 2200/447; H03F 2200/468; H03F 2203/7221; H03F 2203/7236; H03F 2203/7215; H03F 1/05; H04W 52/0254; G06F 1/206; H04M 2250/12; H04M 2250/22; H04M 1/72569
USPC ...................... 330/124 R, 289, 295
See application file for complete search history.

(56) References Cited

U.S. PATENT DOCUMENTS

| | | | | |
|---|---|---|---|---|
| 5,008,631 A | * | 4/1991 | Scherer .................. | G01R 15/09 330/51 |
| 5,774,017 A | * | 6/1998 | Adar ...................... | H03F 1/0261 330/51 |

(Continued)

FOREIGN PATENT DOCUMENTS

KR    10-2004-0092211    11/2004

*Primary Examiner* — Khanh V Nguyen (57) ABSTRACT

A method for an electronic device includes amplifying a signal by a first power amplifier, obtaining a temperature of the first power amplifier during the amplification of the signal, comparing the temperature of the first power amplifier to a predetermined threshold value, and switching the first power amplifier to a second power amplifier for amplifying a signal if the temperature of the first power amplifier is higher than a threshold value. An electronic device for switching power amplifiers are also disclosed.

16 Claims, 4 Drawing Sheets

(51) Int. Cl.
  *G06F 1/20* (2006.01)
  *H03F 1/30* (2006.01)
  *H03F 3/21* (2006.01)
  *H03F 1/02* (2006.01)
  *H04M 1/725* (2006.01)

(56) References Cited

U.S. PATENT DOCUMENTS

| | | | |
|---|---|---|---|
| 7,315,204 B2* | 1/2008 | Seven | H03F 1/0277 |
| | | | 330/51 |
| 7,508,268 B2* | 3/2009 | Sasaki | H01L 27/088 |
| | | | 330/124 R |
| 2014/0199952 A1* | 7/2014 | Sandhu | H03F 1/303 |
| | | | 455/91 |
| 2014/0232467 A1* | 8/2014 | Mukai | H03F 3/195 |
| | | | 330/295 |

* cited by examiner

ELECTRONIC DEVICE AND METHOD FOR SWITCHING POWER AMPLIFIERS

CROSS-REFERENCE TO RELATED APPLICATION AND CLAIM OF PRIORITY

The present application is related to and claims the priority under 35 U.S.C. § 119(a) to Korean Application Serial No. 10-2013-0136948, which was filed in the Korean Intellectual Property Office on Nov. 12, 2013, the entire content of which is hereby incorporated by reference.

TECHNICAL FIELD

The present disclosure relates to an electronic device and a method for switching the power amplifiers to amplify a signal.

BACKGROUND

Recently, various services and additional functions provided by an electronic device are gradually expanded. In order to increase an effective value of the electronic device and meet various demands of users, various applications executable by the electronic device have been developed. Accordingly, at present, at least several hundreds of applications can be stored in the electronic device, which is movable and has a touch screen, such as a smart phone, a mobile phone, a notebook Personal Computer (PC), and a tablet PC.

Accordingly, when the electronic device transmits a signal, a power amplifier amplifies the signal. Most power amplifiers are set to a maximum power so as to maintain a communication connection in a specific circumstance such as a weak electric field. Even though a power amplifier operates for a short period of time under the circumstance, heat is generated, and the heat is transferred to electronic parts, metallic device parts, or a device case. To control the temperature of heat generated from the power amplifier, a plurality of modes for controlling a transmission power is provided based on a circumstance of an electric field. In general, the power amplifier is classified into a high-power mode, a middle-power mode, and a low-power mode, and when the circumstance of a electric field of an adjacent base station is poor, the power amplifier operates in a high-power mode and increases a transmission power of the electronic device to a maximum level so as to maintain the connection.

Therefore, there is a need for various methods to reduce the temperature of heat generated from the electronic device.

SUMMARY

As described above, conventionally, a power mode is changed based on a circumstance of an electric field of an adjacent base station. For example, when an electric field is strong, a transmission power is reduced so as to maintain a temperature of heat to be low. However, in a weak electric field, there is no choice but increase a transmission power and thus, the temperature of heat may not be maintained to be low. Therefore, for this reason, the conventional method fails to maintain the temperature of heat to be low and thus, a user may feel uncomfortable, and in some cases, may be injured such as by a burn or the like.

Accordingly, there is a need of maintaining, to be low, the temperature of heat generated as a power amplifier is used, reducing the displeasure of the user, and extending a lift span of an electronic device.

A power controlling method for an electronic device includes amplifying a signal by a first power amplifier, obtaining a temperature of the first power amplifier during the amplification of the signal, comparing the temperature of the first power amplifier to a predetermined threshold value; and switching the first power amplifier to a second power amplifier for amplifying a signal if the temperature of the first power amplifier is higher than a predetermined threshold value.

In some embodiment, the method further comprises causing the switch to switch the second amplifier to the first amplifier for amplifying the signal if a temperature of the second amplifier is higher than the predetermined threshold value.

In some embodiment, the temperature of the first amplifier is measured by a first sensor, and a temperature of the second amplifier is measured by a second sensor.

In some embodiment, the first sensor is located adjacent to or on the first amplifier, and a second sensor is located adjacent to or on the second amplifier.

In some embodiment, the temperature of the first amplifier or the second amplifier is estimated based on its operation time.

In some embodiment, the method further comprises measuring the temperature of heat based on at least one mode of the first power amplifier.

In some embodiment, the first amplifier and the second amplifier are incorporated into one of the transceiving unit and a Front End Module Integrated Duplexer (FEMiD).

In some embodiment, the first amplifier and the second amplifier are located apart from each other so that one of the first amplifier and the second amplifier is not covered under a user's hand if the user grips the electronic device with the hand.

In some embodiment, the first amplifier that is adjacent to a screen is deactivated, and the second amplifier that is located on an opposite side of the screen is activate if a touch of a body part is sensed on the screen during a voice call.

In some embodiment, the method further comprises, if a part of a user's body is sensed on the electronic device, adjusting the threshold value for an amplifier that is closest to the part of a user's body.

In some embodiment, if a part of a user's body is sensed on the electronic device, the method further comprises switching a current amplifier to another amplifier that is farther away from the part of the user's body.

An electronic device for controlling power includes a first amplifier and a second amplifier, each configured to amplify a signal, a switch configured to switch between the first amplifier and the second amplifier for amplifying a signal, and a controller configured to cause the switch to let the first amplifier to amply a signal, obtain a temperature of the first amplifier during the amplification of the signal by a first sensor, compare the temperature of the first amplifier to a predetermined threshold value, and cause the switch to switch the first amplifier to a second amplifier for amplifying the signal if the temperature of the first amplifier is higher than a predetermined threshold value.

According to various embodiments of the present disclosure, a temperature of heat of an electronic device is reduced using two or more power amplifiers so that the displeasure of a user may be alleviated.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device. The present disclosure may have various modifications and embodiments and thus will be described in detail by exemplifying specific embodiments through drawings. However, it should be understood that the present disclosure is not limited to the specific embodiments, but the present disclosure includes all modifications, equivalents, and alternatives within the spirit and the scope of the present disclosure.

Although the terms including an ordinal number such as first, second, etc. can be used for describing various elements, the structural elements are not restricted by the terms. The terms are only used to distinguish one element from another element. For example, without departing from the scope of the present disclosure, a first structural element may be named a second structural element. Similarly, the second structural element also may be named the first structural element. As used herein, the term "and/or" includes any and all combinations of one or more associated items.

In the present disclosure, the terms are used to describe a specific embodiment, and are not intended to limit the present disclosure. As used herein, the singular forms are intended to include the plural forms as well, unless the context clearly indicates otherwise. In the description, it should be understood that the terms "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless defined differently, all terms used herein, which include technical terminologies or scientific terminologies, have the same meaning as that understood by a person skilled in the art to which the present disclosure belongs. It should be interpreted that the terms, which are identical to those defined in general dictionaries, have the meaning identical to that in the context of the related technique. The terms should not be ideally or excessively interpreted as a formal meaning.

Hereinafter, an operation principle for an embodiment of the present disclosure will be described in detail with reference to the accompanying drawings. In describing the present disclosure, detailed descriptions related to well-known functions or configurations will be omitted when they may make subject matters of the present disclosure unnecessarily obscure. The terms which will be described below are terms defined in consideration of the functions in the present disclosure, and may be different according to users, intentions of the users, or customs. Therefore, the definitions of the terms should be determined based on the contents throughout the specification.

Figure 1:
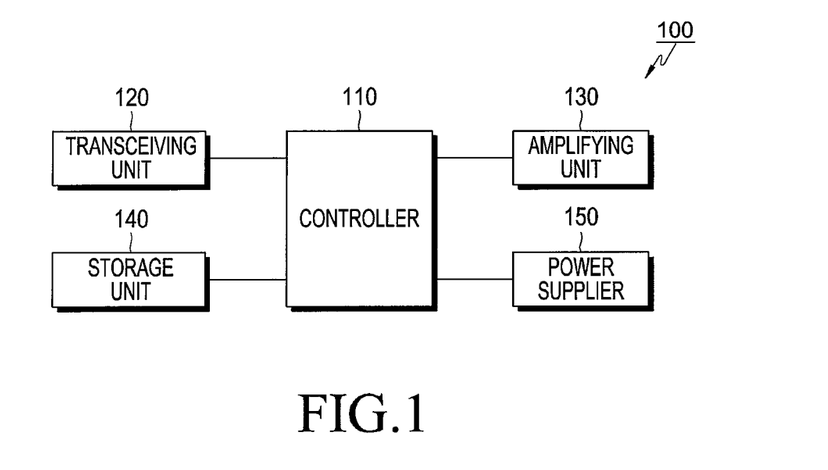
FIG. 1 is a view illustrating an example of an electronic device according to various embodiments of the present disclosure.

FIG. 1 is a view illustrating an example of an electronic device according to various embodiments of the present disclosure.

Referring to FIG. 1, an electronic device 100 can be connected to an external device (not illustrated) using at least one of a transceiving unit (or a transceiver) 120, a connector (not illustrated), and an earphone connection jack (not illustrated). The external device can include various devices attached to or detached from the electronic device 100 through a wire, such as an earphone, an external speaker, a Universal Serial Bus (USB) memory, a charger, a cradle/dock, a Digital Multimedia Broadcasting (DMB) antenna, a mobile payment related device, a health management device (blood sugar tester or the like), a game machine, a car navigation device and the like. Further, the electronic device can include a Bluetooth communication device, a Near Field Communication (NFC) device, a WiFi Direct communication device, and a wireless Access Point (AP) which can be wirelessly connected. The electronic device can be connected to another device wiredly or wirelessly, such as a portable terminal, a smart phone, a tablet Personal Computer (PC), a desktop PC, a digitizer, an input device, a camera and a server.

Referring to FIG. 1, the electronic device 100 can include the transceiving unit 120, an amplifying unit 130, a storage unit 140, and a power supplier 150.

The electronic device of the present disclosure is a mobile terminal that is capable of performing data transmission/reception, a voice call, and a video call, and can include at least one screen. The screen can display a result executed in at least one application. The electronic device can include a smart phone, a tablet PC, 3D-TeleVision (TV), a smart TV, a Light Emitting Diode (LED) TV, a Liquid Crystal Display (LCD) TV, a table PC, and the like, and also can include all devices which can communicate with a peripheral device or another terminal located at a remote place. Further, at least one screen included in the electronic device can receive an input by at least one of a touch and a hovering.

The electronic device 100 can include at least one screen which provides a user with a user interface corresponding to various services, for example, a call, a data transmission, broadcasting, photographing, and an input of a character string.

The controller 110 can include a Central Processing Unit (CPU), a Read Only Memory (ROM) storing a control program for controlling the electronic device 100, and a Random Access Memory (RAM) used as a storage area for storing a signal or data input from the outside of the electronic device 100 or for work performed in the electronic device 100. The CPU can include a single core type CPU, a dual core type CPU, a triple core type CPU, or a quad core type CPU.

In addition, the controller 110 can control at least one of the transceiving unit 120, the amplifying unit 130, the storage unit 140, and the power supplier 150. The amplifying unit 130 can include at least one power amplifier.

The controller 110 can determine whether hovering is measured as various input units approach any object on a screen, and identify an object corresponding to a location where the hovering has occurred. The controller 110 can detect a height from the electronic device 100 to the input unit, and a hovering input event based on a height, in which the hovering input event can include at least one of a press of a button formed in the input unit, a tap on the input unit, a movement of the input unit at a speed higher than a predetermined speed, and a touch on an object.

The controller 110 according to an embodiment of the present disclosure transmits a signal amplified by a first power amplifier, measures a temperature of heat of the first power amplifier in response to the amplification of the signal, controls switching to a second power amplifier based on a comparison between the measured temperature of heat and a predetermined threshold value, and amplifies a signal using the second power amplifier to which switching is controlled and transmits the same. When the measured temperature of heat exceeds the predetermined threshold value, the controller 110 switches a switch to the second power amplifier. The controller 110 measures the temperature of heat generated from the first power amplifier, and switches the switch to the second power amplifier when the measured temperature exceeds the predetermined threshold value. In addition, the controller 110 measures a temperature of heat generated from the second power amplifier, and switches the switch to the first power amplifier when the measured temperature exceeds the predetermined threshold value. When the temperature of heat generated from the first power amplifier exceeds the predetermined threshold value, the controller 110 changes the first power amplifier to a deactivated mode, and activates the second power amplifier. When the temperature of heat generated from the second power amplifier exceeds the predetermined threshold value, the controller 110 changes the second power amplifier to a deactivated mode, and activates the first power amplifier. The controller 110 controls a switch for transceiving a signal to each power amplifier, and controls the switch to amplify a signal through a corresponding power amplifier. The controller 110 can measure a temperature of heat generated from a power amplifier based on at least one mode of the power amplifier. In addition, when a touch of a body part is sensed through a grip sensor included in the electronic device, the controller 110 can adjust a predetermined threshold value and control switching of a power amplifier. The grip sensor can be included in the electronic device as a separate device, or can be an application installed in the electronic device and thus, can be controlled by the controller 110. When a touch of a body part is sensed through a grip sensor (not illustrated), the controller 110 can adjust the predetermined threshold value to be high or low.

A power amplifier according to various embodiments of the present disclosure can amplify a signal using one of a high power mode, a middle power mode, a low power mode, based on a strength of an amplified power. The controller 110 can have different threshold values based on a power mode, and switching of a switch can be controlled based on a power mode. The controller 110 can measure a temperature of heat generated from a power amplifier using at least one of a transmission power and an operation time corresponding to at least one mode of the power amplifier. A temperature of heat generated from each power amplifier can be different based on at least one of a power mode and an operation time. For example, when a power amplifier operates in a high-power mode, the power amplifier readily generates heat in a short time. In addition, when a power amplifier operates in a low power mode, heat generated from the power amplifier reaches a temperature identical to that of heat generated in the high power mode after a time longer than a time that is taken to generate heat of the identical temperature in the high-power mode. In addition, the controller 110 can measure a temperature of heat generated from a power amplifier through a temperature sensor (for example: thermistor) located adjacent to a power amplifier. The temperature sensor includes various devices or applications that can measure temperature, in addition to the thermistor. The controller 110 can periodically or aperiodically check a temperature sensor placed in a location adjacent to each power amplifier, so as to measure a temperature of heat. At least one power amplifier according to various embodiments of the present disclosure can be included in the amplifying unit 130, or can be separately included. In addition, the amplifying unit 130 can include a temperature sensor allocated for each power amplifier.

The controller 110 can control switching to the second power amplifier when a temperature of heat measured through at least one of a transmission power and an operation time corresponding to a current mode of the first power amplifier exceeds a predetermined threshold value, and a temperature of heat measured through a temperature sensor located adjacent to the first power amplifier exceeds the predetermined threshold value. In addition, the controller 110 switches the switch to the second power amplifier when the temperature of heat measured through at least one of the transmission power and the operation time corresponding to the current mode of the first power amplifier exceeds the predetermined threshold value. The controller 110 controls switching to the second power amplifier when the temperature of heat measured through the temperature sensor located adjacent to the first power amplifier exceeds the predetermined threshold value. In a case of a threshold value according to various embodiments of the present disclosure, a value for controlling the switching based on at least one of a power mode of a power amplifier, a transmission power of the power amplifier, an operation time of the power amplifier, can be set in advance. At least one power amplifier according to various embodiments of the present disclosure can be installed in any location of the electronic device or next to any component element of the electronic device. In addition, when a touch of a body part is sensed by a screen (not illustrated) as a voice call is executed, the controller 110 can control switching of respective power amplifiers that can be located in different locations of the electronic device. When a touch of a body part is sensed by a screen as a voice call is executed, the controller 110 deactivates a power amplifier that is closest to the screen (not illustrated) and activates a power amplifier that is most distant from the screen (not illustrated). Through the above, a user can recognize that a temperature of heat felt through a body part (for example, a body part that touches a screen during a voice call) during a voice call is low.

The controller 110 according to another embodiment of the present disclosure senses a signal transceived through the transceiving unit 120, senses a signal amplified by the amplifying unit 130 including at least one power amplifier, measures a temperature of heat generated from a power amplifier in response to the amplified signal, and controls switching of a power amplifier based on a comparison between the measure temperature of heat and a predetermined threshold value. The amplifying unit 130 according to another embodiment of the present disclosure can be included in the transceiving unit 120 or can be installed outside as a separated device. The present disclosure can further include a switch that switches a signal to one of at least two power amplifiers. When a temperature of heat generated from a power amplifier exceeds a predetermined threshold value, the switch is switched to another power under a control of the controller 110, and can be included in one of the transceiving unit 120 and the controller 110, or can be separately included. The amplifying unit 130 according to various embodiments of the present disclosure can include at least one power amplifier, and each power amplifier can include a temperature sensor for measuring a temperature of heat. A mode of each power amplifier can be converted into an activated mode or a deactivated mode, based on a temperature of heat. When a temperature of heat of the first power amplifier that amplifies a signal exceeds a predetermined threshold value, the controller 110 can control switching of a switch to enable the second power amplifier to amplify the signal. When a temperature of heat of the second power amplifier that amplifies a signal exceeds a predetermined threshold value, the controller 110 can control switching of a switch to enable the first power amplifier to amplify the signal.

When a temperature of heat generated from the first power amplifier as a current signal is transmitted, exceeds a predetermined threshold value, the controller 110 changes the first power amplifier to a deactivated mode, and changes the second power amplifier to an activated mode. In addition, when a temperature of heat generated from the second power amplifier as a current signal is transmitted, exceeds a predetermined threshold value, the controller 110 changes the second power amplifier to a deactivated mode, and changes the first power amplifier or a third power amplifier to an activated mode. The controller 110 can measure a temperature of heat using at least one of a transmission power and an operation time corresponding to at least one mode of a power amplifier. A power amplifier according to various embodiments of the present disclosure can amplify a signal using one of a high power mode, a middle power mode, a low power mode, based on a strength of amplified power. The controller 110 can have different threshold values based on a power mode, and switching of a switch can be controlled based on a power mode. The controller 110 can measure a temperature of heat generated from a power amplifier using at least one of a transmission power and an operation time corresponding to at least one mode of a power amplifier. A temperature of heat generated from each power amplifier can be different based on at least one of a power mode and an operation time.

The controller 110 can switch a switch to the second power amplifier when a temperature of heat measured through at least one of a transmission power and an operation time corresponding to a current mode of the first power amplifier exceeds a predetermined threshold value, and a temperature of heat measured through a temperature sensor located adjacent to the first power amplifier exceeds the predetermined threshold value. In addition, the controller 110 switches the switch to the second power amplifier when the temperature of heat measured through at least one of the transmission power and the operation time corresponding to the current mode of the first power amplifier exceeds the predetermined threshold value. The controller 110 switches the switch to the second power amplifier when the temperature of heat measured through the temperature sensor located adjacent to the first power amplifier exceeds a predetermined threshold value.

The transceiving unit 120 can include a mobile communication unit (not illustrated), a sub-communication unit (not illustrated), a wireless LAN (not illustrated), and a short-range communication unit (not illustrated), based on a communication scheme, a transmission distance, and a type of transmitted and received data. The mobile communication unit enables the electronic device 100 to be connected to an external device through mobile communication using at least one antenna (one or more antennas) (not illustrated) under a control of the controller 110. The mobile communication unit can transmit/receive a wireless signal for a voice call, a video call, a Short Message Service (SMS), or a Multimedia Message Service (MMS) to/from a portable phone (not illustrated), a smart phone (not illustrated), a tablet PC, or another device (not illustrated), which has a phone number input to the electronic device 100. The sub-communication unit can include at least one of the wireless LAN unit (not illustrated) and the short-range communication unit (not illustrated). For example, the sub-communication unit can include only the wireless LAN unit, or only the short-range communication unit, or both the wireless LAN unit and the short-range communication unit. Further, the sub-communication unit can transmit and receive a control signal to/from the input unit. The wireless LAN unit can access the Internet in a place where a wireless Access Point (AP) (not illustrated) is installed, under a control of the controller 110. The wireless LAN unit supports the wireless LAN standards (IEEE 802.11x) of the Institute of Electrical and Electronics Engineers (IEEE). The short-range communication unit can wirelessly perform short-range communication between the electronic device 100 and an image forming device (not illustrated), under a control of the controller 110. The short-range communication scheme can include a Bluetooth communication scheme, an Infrared Data Association (IrDA) scheme, a Wi-Fi Direct communication scheme, a Near Field Communication (NFC) scheme, and the like. In the various embodiments of the present disclosure, at least one of the mobile communication unit, the wireless LAN unit, the screen and the short-range communication unit, or a combination thereof is referred to as a transmission unit, and it does not limit the scope of the present disclosure.

The amplifying unit 130 can include at least one power amplifier. The amplifying unit 130 can include at least one power amplifier, and can include a temperature sensor for measuring a temperature of heat generated from each power amplifier. Each power amplifier can be installed in any location of the electronic device. The power amplifier can be included directly under a screen or can be included in the back side of the electronic device. In addition, while a voice call is executed, the power amplifier included directly under the screen can be changed into a deactivated mode and the power amplifier included in the back side of the electronic device can be changed into an activated mode. In addition, at least one power amplifier included in the amplifying unit 130 can be changed into an activated or a deactivated mode under a control of the controller 110.

The storage unit 140 can store a signal or data input/output in response to operations of the transceiving unit 120, under a control of the controller 110. The storage unit 140 can store a control program and applications for controlling the electronic device 100 or the controller 110. The storage unit 140 can store a threshold value corresponding to at least one of a power mode of a power amplifier, a transmission power of the power amplifier, and an operation time of the power amplifier. The threshold value can be different for each of the power mode of the power amplifier, the transmission power of the power amplifier, and the operation time of the power amplifier, or can be identical. The storage unit 140 can include a nonvolatile memory, a volatile memory, a Hard Disk Drive (HDD), or a Solid State Drive (SSD).

The storage unit 140 is a machine (for example, a computer)-readable medium, and the term of the machine-readable medium can be defined as a medium for providing data to the machine such that the machine can perform a specific function. The machine-readable medium can be a storage medium. The storage unit 140 can include a nonvolatile medium and a volatile medium. All of these media should be tangible so that commands transferred by the media can be detected by a physical instrument through which the machine reads the commands.

The power supplier 150 can supply electric power to one or more batteries (not illustrated) disposed in a housing of the electronic device 100 under a control of the controller 110. The one or more batteries (not illustrated) supply electrical power to the electronic device 100. Further, the power supplier 150 can supply, to the electronic device 100, electrical power input from an external power source (not illustrated) through a wired cable connected to a connector (not illustrated). Furthermore, the power supplier 150 can supply electric power, which is wirelessly input from the external electric power source through a wireless charging technology, to the electronic device 100.

Figure 2:
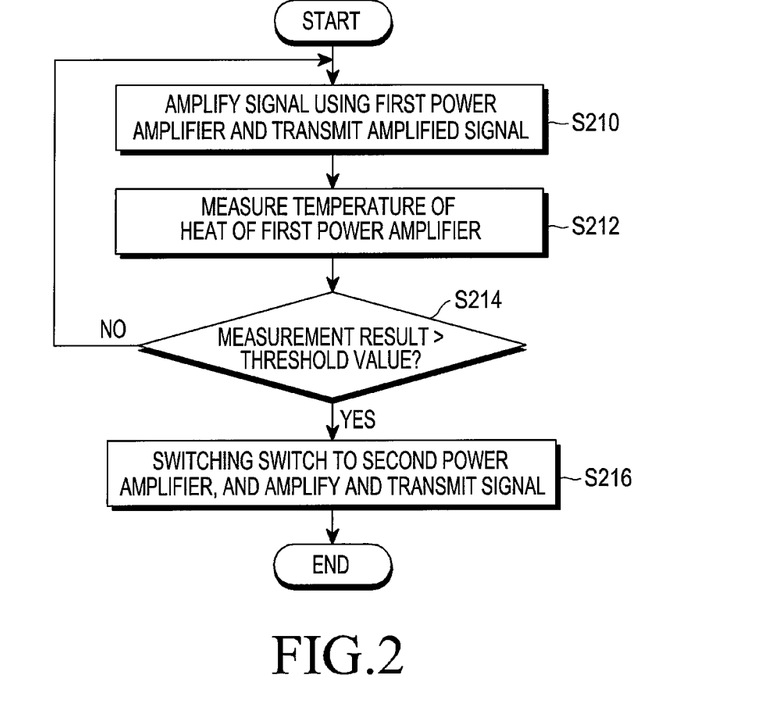
FIG. 2 is a flowchart illustrating a process of controlling power of an electronic device according to an embodiment of the present disclosure.

FIG. 2 is a flowchart illustrating a process of controlling power of an electronic device according to an embodiment of the present disclosure.

Hereinafter, the process of controlling power of the electronic device according to the embodiment of the present disclosure will be described as follows.

The controller 110 amplifies a signal using a first power amplifier and transmits the amplified signal in operation S210, and measures a temperature of heat generated from the first power amplifier in operation S212. The controller 110 can measure a temperature of heat based on at least one mode of the first power amplifier. The controller 110 can measure a temperature of heat using at least one of a transmission power of the first power amplifier and an operation time of the first power amplifier corresponding to the at least one mode. The controller 110 can measure a temperature of heat through a temperature sensor located adjacent to the first power amplifier. The first power amplifier can be an initial power amplifier that amplifies a signal that is transmitted to a base station for communication with another electronic device. A power amplifier according to various embodiments of the present disclosure can operate in a low-power mode, a middle-power mode, or a high-power mode, so as to amplify the power amplifier with a transmission power designated based on a base station and a circumstance of an electric field. The change of the power mode can be controlled by a baseband or the controller 110, and can be designated by 2 bits (for example, 00, 01, 10, and 11). The controller 110 can measure or predict a temperature of heat through a power mode, an operation time, a temperature sensor (not illustrated) of a power amplifier included in an electronic device. A temperature of heat that exceeds a predetermined threshold value can be generated when a power amplifier designated by the electronic device operates in maximum power, and the controller 110 can measure a temperature of heat generated as the power amplifier operates with the maximum power.

The controller 110 can regard a temperature when an operation time of a power amplifier exceeds a predetermined period of time, as a temperature of heat that exceeds a threshold value. Table 1 below lists a power mode of a power amplifier, a transmission power section, and an operation time associated with a temperature of heat that is regarded as a temperature of heat that exceeds a predetermined threshold value.

TABLE 1

| Power mode of power amplifier | Transmission power section | Operation time |
|---|---|---|
| High-power mode | Greater than or equal to 15 dBm | 10 minutes |
| Middle-power mode | 0~15 dBm | 30 minutes |
| Low-power mode | Less than or equal to 0 dBm | 90 minutes |

As listed in Table 1, when a power amplifier operates in a high-power mode and operates with power greater than or equal to 15 dBm for at least 10 minutes, the controller 110 determines that a temperature of heat generated from the power amplifier exceeds a predetermined threshold value, when the power amplifier operates in a middle-power mode and operates with power between 0 and 15 dBm for at least 30 minutes, the controller 110 determines that a temperature of heat generated from the power amplifier exceeds the predetermined threshold value, and when the power amplifier operates in a low-power mode, and operates with power less than or equal to 0 dBm for at least 90 minutes, the controller 110 determines that a temperature of heat generated from the power amplifier exceeds the predetermined threshold value.

The controller 110 can predict a temperature of heat through a temperature sensor located adjacent to each power amplifier. Table 2 below lists a change of a code based on a temperature of a temperature sensor. A temperature of heat generated from a power amplifier can be predicted based on a distance between a power amplifier and the temperature sensor and a measurement error.

TABLE 2

| | Temperature | | | | |
|---|---|---|---|---|---|
| | 60° C. | 40° C. | 38° C. | 35° C. | 25° C. (room temperature) |
| Temperature sensor CODE | 600 | 780 | 820 | 980 | 1140 |
| Actual temperature of heat from power amplifier | 63° C. | 43° C. | 40° C. | 37° C. | 28° C. |

As listed in Table 2, an actual temperature of heat generated from a power amplifier can be predicted through the temperature sensor. When a temperature is 60° C., a code value of the temperature sensor is 600 and an actual temperature of heat of the power amplifier is 63° C., when a temperature is 40° C. a code value of the temperature sensor is 780 and an actual temperature of heat of the power amplifier is 43° C., and when a temperature is 38° C., a code value of the temperature sensor is 820 and an actual temperature of heat of the power amplifier is 40° C. When a temperature is 35° C., a code value of the temperature sensor is 980 and an actual temperature of heat of the power amplifier is 37° C., and when it is room temperature, that is, a temperature is 25° C., a code value of the temperature sensor is 1140 bits and an actual temperature of heat of the power amplifier is 28° C. As described above, as a temperature becomes lower, a code of the temperature sensor becomes higher and accordingly, an actual temperature of heat generated from a power amplifier becomes lower. However, this is merely an example, and according to the present disclosure, a code can become higher as a temperature becomes higher based on a type of temperature sensor. However, the code value can be one of a binary number, an octal number, and a hexadecimal number. The controller 110 can predict a temperature of heat generated from a power amplifier by setting a predetermined threshold value in the temperature sensor.

When a measurement result exceeds a predetermined threshold value in operation S214, the controller 110 switches a switch to the second power amplifier and amplifies a signal for transmission in operation S216. The controller 110 can control switching based on a temperature of heat generated from at least one power amplifier. The controller 110 can control switching to the second power amplifier when a temperature of heat measured from the first power amplifier exceeds a predetermined threshold value or when a temperature of heat predicted from the first power amplifier exceeds the predetermined threshold value. The switching operation can include changing the first power amplifier to a deactivated mode, and changing the second power amplifier to an activated mode. The controller 110 can control switching to the first power amplifier or a third power amplifier when a temperature of heat measured from the second power amplifier exceeds a predetermined threshold value or when a temperature of heat predicted from the second power amplifier exceeds the predetermined threshold value. The switching operation can include changing the second power amplifier to a deactivated mode, and changing the second power amplifier to an activated mode.

The controller 110 can measure or predict a temperature of heat generated from a power amplifier through a power mode and an operation time of the power amplifier. In addition, the controller 110 can measure or predict a temperature of heat through a temperature sensor. In addition, the controller 110 can measure or predict a temperature of heat using one or both of a first method that measures or predicts a temperature of heat generated from a power amplifier through a power mode and an operation time of the power amplifier and a second method that measures or predicts a temperature of heat through a temperature sensor. The controller 110 can control switching to the second power amplifier when a temperature of heat measured through at least one of a transmission power and an operation time corresponding to a current mode of the first power amplifier exceeds a predetermined threshold value, and a temperature of heat measured through a temperature sensor located adjacent to the first power amplifier exceeds the predetermined threshold value. The controller 110 can change a power amplifier corresponding to the measured or predicted temperature of heat to a deactivated mode, and can change another power amplifier to an activated mode. In addition, the controller 110 can control switching of a switch so as to change a power amplifier corresponding to the measured or predicted temperature of heat to a deactivated mode, and to change another power amplifier to an activated mode. When switching occurs among a plurality of power amplifiers, the controller 110 can control each power amplifier to accurately maintain power. The controller 110 recognizes a power state of the first power amplifier before the first power amplifier is deactivated for switching a power amplifier, and maintains the first power amplifier as an idle state. Subsequently, the controller 110 changes the second power amplifier to an activated mode and maintain a signal transmission, after the first power amplifier is deactivated through switching.

In addition, the controller 110 can measure or predict a temperature of heat generated from a power amplifier, through a temperature sensor. The controller 110 controls switching associated with a plurality of power amplifiers by designating a threshold value corresponding to a reference temperature or a temperature limit, so as to control a power amplifier based on a temperature of heat that is measured through the temperature sensor.

Figure 3:
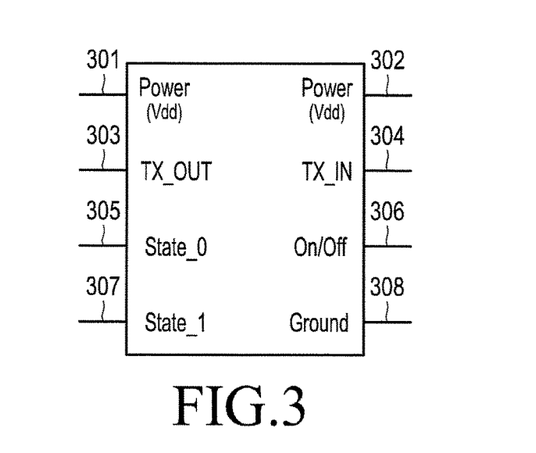
FIG. 3 is a view illustrating an example of a power amplifier according to an embodiment of the present disclosure.

FIG. 3 is a view illustrating an example of a power amplifier according to an embodiment of the present disclosure.

Referring to FIG. 3, a power amplifier according to an embodiment of the present disclosure is formed of pins 301 and 302 corresponding to a driving voltage, pins 305 and 307 for receiving a signal for controlling a power mode of a power amplifier, pins 303 and 304 for transceiving power from FEMiD, a pin 306 corresponding to activation or deactivation of a power amplifier, and a pin 308 corresponding to an ground.

Table 3 below lists a state of a pin based on a power mode of a power amplifier.

TABLE 3

| Power mode of power amplifier | State_0 | State_1 |
|---|---|---|
| High-power mode | 1 | 1 |
| Middle-power mode | 1 | 0 |
|  | 0 | 1 |
| Low-power mode | 0 | 0 |

A power amplifier operates in a high-power mode when a bit that is output from the FEMiD and input into State_0 305 is 1 and a bit that is output from the FEMiD and is input into State_1 307 is 1. In addition, a power amplifier operates in a middle-power mode when a bit that is output from the FEMiD and is input into State_0 305 is 1 and a bit that is output from the FEMiD and is input into State_1 307 is 0, or when a bit that is output from the FEMiD and is input into State_0 305 is 0 and a bit that is output from the FEMiD and is input into State_1 307 is 1. In addition, a power amplifier operates in a low-power mode when a bit that is output from the FEMiD and is input into State_0 305 is 0 and a bit that is output from the FEMiD and is input into State_1 307 is 0.

Figure 4A:
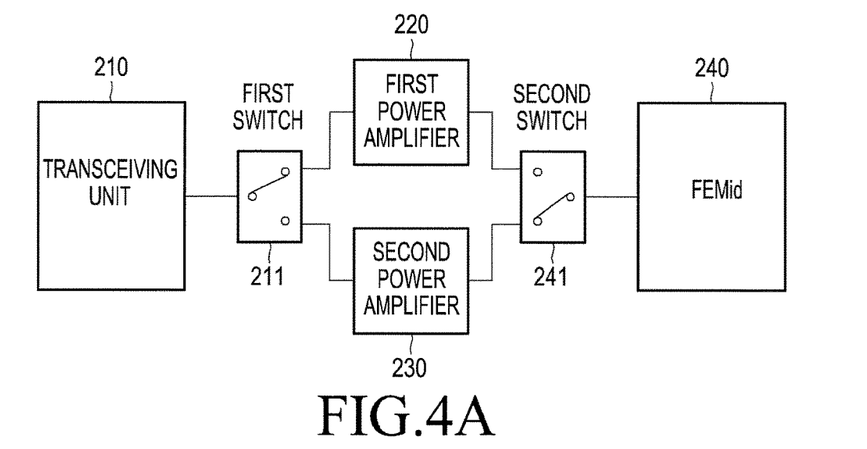
FIG. 4A is a view illustrating an example of a separate switch configured for controlling power of an electronic device according to an embodiment of the present disclosure.
Figure 4B:
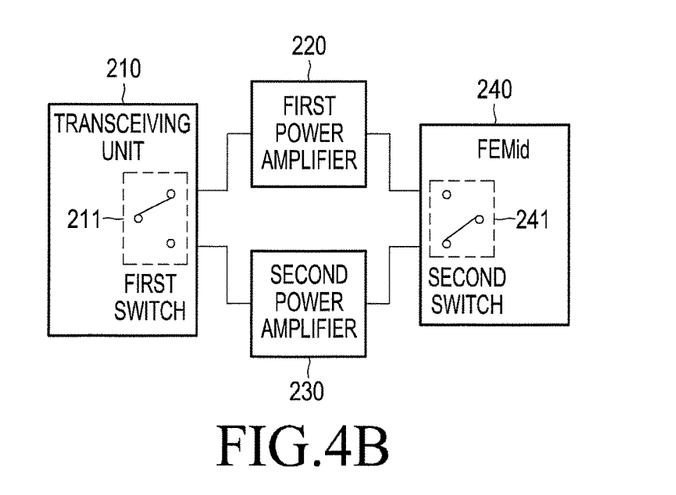
FIG. 4B is a view illustrating an example in which switches are included in a transceiving unit and a Front End Module Integrated Duplexer (FEMiD), respectively, for controlling power of an electronic device, according to an embodiment of the present disclosure.

FIGS. 4A and 4B are views illustrating examples of a configuration of a circuit for controlling power of an electronic device according to an embodiment of the present disclosure.

Referring to FIGS. 4A and 4B, FIG. 4A is a view illustrating an example of a separate switching configured for controlling power of an electronic device according to an embodiment of the present disclosure, and FIG. 4B is a view illustrating an example in which switches are included in a transceiving unit and a Front End Module Integrated Duplexer (FEMiD), respectively, to control power of an electronic device according to an embodiment of the present disclosure.

The FEMiD according to an embodiment of the present disclosure affects qualities of various services provided in the electronic device 100, and can configure a single module including components from a portion excluding an antenna (not illustrated) in the electronic device 100 to a portion before a Low Noise Amplifier (LNA), such as an Antenna Switch Module (ASM), a Duplexer, a power amplifier, an RF filter, passive element components. In addition, the FEMiD can be integrated into a duplexer.

Referring to FIGS. 4A and 4B, it is assumed that a signal output from the FEMiD 240 is amplified in the first power amplifier 220 through a second switch 241, and passes through a first switch 211 and is output through the transceiving unit 210. In this instance, the controller 110 measures or predicts a temperature of heat generated from the first power amplifier, and compares the measured or predicted temperature of heat with a predetermined threshold value. When the measured or predicted temperature of heat exceeds the predetermined threshold value, the controller 110 controls the first switch 211 and the second switch 241 to be switched to the second power amplifier 230. The controller 110 changes the first power amplifier to a deactivated mode, and changes the second power amplifier to an activated mode. The second power amplifier 230 is in a deactivated mode before switching is performed and thus, a temperature of heat is close to zero. Subsequently, while a signal is amplified through the second power amplifier 230, the controller 110 can measure or predict a temperature of heat generated from the second power amplifier 230. When the temperature of heat measured or predicted in the second power amplifier exceeds the predetermined threshold value, the controller 110 controls the first switch 211 and the second switch 241 to be switched to the first power amplifier 220. The controller 110 changes the second power amplifier again to a deactivated mode, and changes the first power amplifier again to an activated mode. The first power amplifier 230 is maintained as a deactivated mode while the second power amplifier 230 is activated and thus, a temperature of heat is close to zero. As described above, the controller 110 switches a plurality of power amplifiers so as to decrease a temperature felt by a user. Although FIG. 4A illustrates that the first switch 211 and the second switch 241 are separately configured, the first switch 211 and the second switch 241 can be included in the transceiving unit 210 and the FEMiD 240, respectively, as shown in FIG. 4B.

Figure 5:
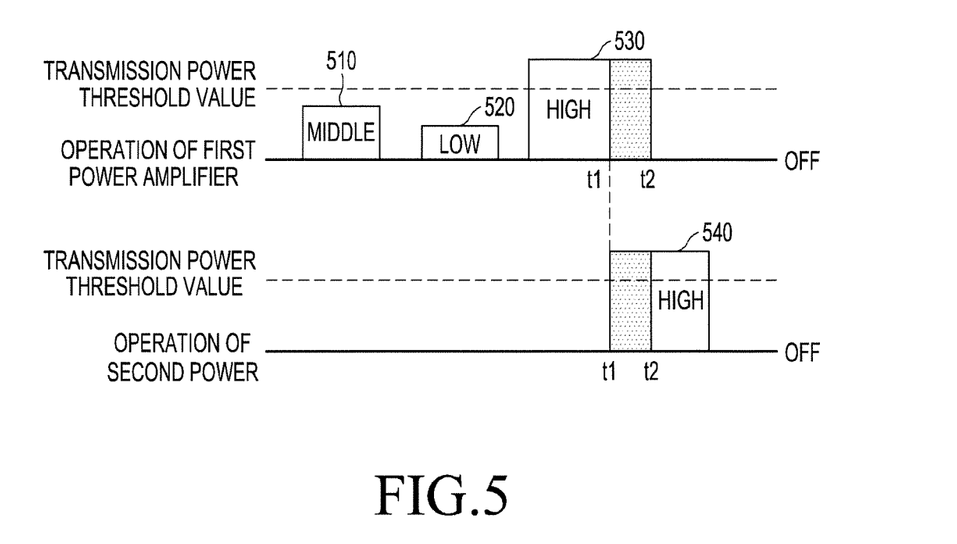
FIG. 5 is a view illustrating an example of switching based on a power mode and an operation time of a power amplifier according to an embodiment of the present disclosure.

FIG. 5 is a view illustrating an example of switching based on a power mode and an operation time of a power amplifier according to an embodiment of the present disclosure.

Referring to FIG. 5, when a signal is amplified through a first power amplifier, a strength of power in a middle-power mode 510 and a low-power mode 520 of the first power amplifier can be lower than a predetermined threshold value. In this instance, although switching to another power amplifier does not occur, a strength of power in a high-power mode 530 becomes higher than the predetermined threshold value, over time. For this reason, the strength of power in the high-power mode 530 is greater than the strength of power in the middle-power mode and the low-power mode, and a temperature of heat also increases over time. When a predetermined period of time t1 passes in the high-power mode 530, a temperature of heat exceeds a threshold value due to an operation of the first power amplifier in the high-power mode. In this instance, the controller 110 can control a switch to be switched from the first power amplifier to the second power amplifier. The first power amplifier is converted to a deactivated mode, and the second power amplifier is converted to an activated mode after a predetermined period of time t2. In FIG. 5, although a temperature of heat generated when the first power amplifier operates in the high-power mode, exceeds a threshold value after the predetermined period of time t1, a time longer than the predetermined period of time t1 is taken for a temperature of heat to exceed the threshold value in the middle-power mode. In addition, a time longer than the time taken for the temperature of heat in the middle-power mode to exceed the threshold value is taken for a temperature of heat in the low-power mode to exceed the threshold value.

Figure 6:
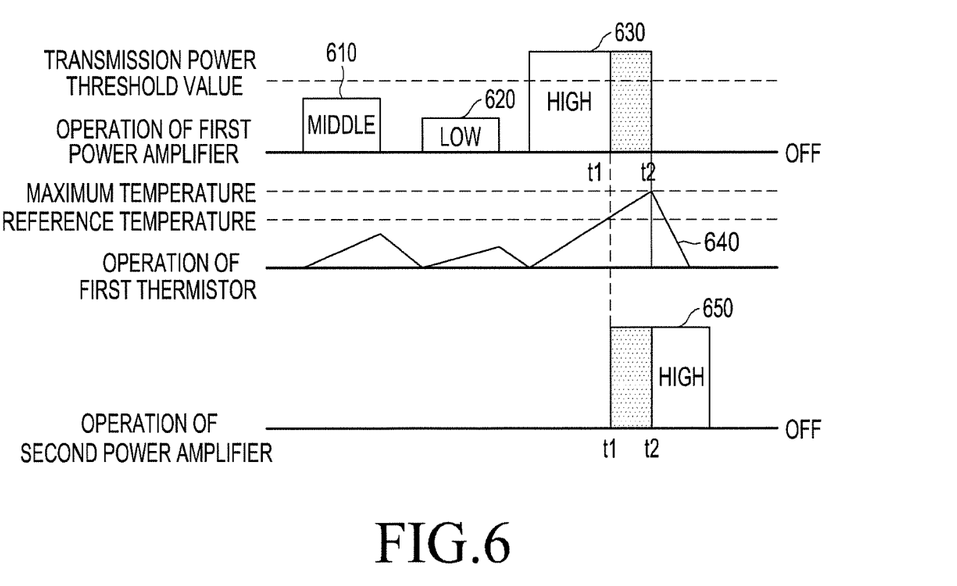
FIG. 6 is a view illustrating an example of switching based on an operation mode of a power amplifier and a temperature of heat measured by a temperature sensor according to another embodiment of the present disclosure.

FIG. 6 is a view illustrating an example of switching based on an operation mode of a power amplifier and a temperature of heat measured by a temperature sensor according to another embodiment of the present disclosure.

Referring to FIG. 6, when a signal is amplified through a first power amplifier, a strength of power in a middle-power mode 610 and a low-power mode 620 of the first power amplifier can be lower than a predetermined threshold value. In this instance, although switching to another power amplifier does not occur, a strength of power in a high-power mode 630 becomes higher than the predetermined threshold value, over time. Accordingly, a temperature 640 measured through a first temperature sensor that measures a temperature of heat generated from the first power amplifier can also increase. For this reason, the strength of power in the high-power mode 630 is greater than the strength of power in the middle-power mode and the low-power mode, and a temperature of heat is also increased over time. When a predetermined period of time $t_1$ passes in the high-power mode 630, a temperature of heat measured through the first temperature sensor exceeds a threshold value due to an operation of the first power amplifier in the high-power mode. In this instance, the controller 110 can control a switch to be switched from the first power amplifier to the second power amplifier. The first power amplifier is converted to a deactivated mode, and the second power amplifier is converted to an activated mode after a predetermined period of time $t_2$. In FIG. 6, although a temperature of heat generated when the first power amplifier operates in the high-power mode, exceeds a threshold value after the predetermined period of time $t_1$, a time longer than the predetermined period of time $t_1$ is taken for a temperature of heat to exceed the threshold value in the middle-power mode. In addition, a time longer than the time taken for the temperature of heat in the middle-power mode to exceed the threshold value is taken for a temperature of heat in the low-power mode to exceed the threshold value.

Figure 7:
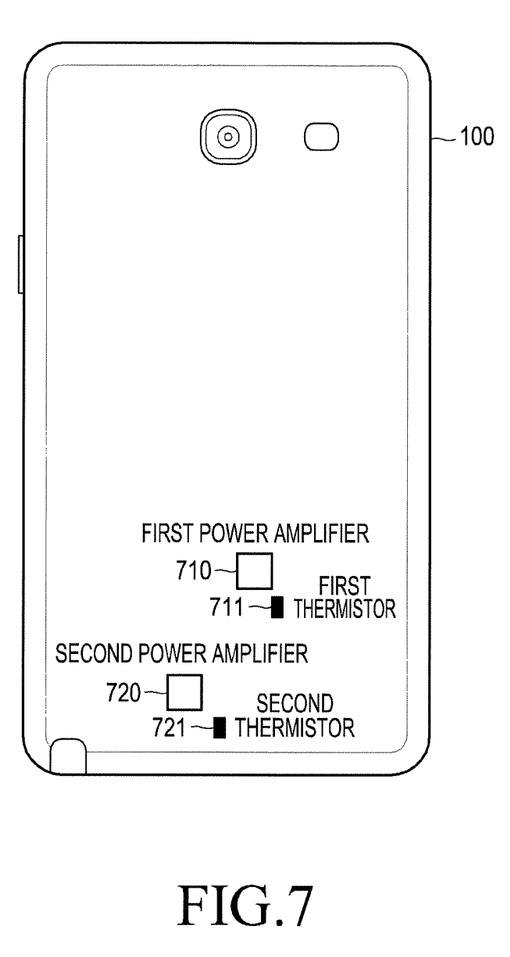
FIG. 7 is a view illustrating an example of an electronic device that includes at least one power amplifier and a corresponding temperature sensor, according to an embodiment of the present disclosure.

FIG. 7 is a view illustrating an example of an electronic device that includes at least one power amplifier and a corresponding temperature sensor(s), according to an embodiment of the present disclosure.

Referring to FIG. 7, a first power amplifier 710 is located at a certain position on a board of the electronic device, and a corresponding first temperature sensor 711 is located adjacent to or on the first power amplifier 710. Also, a second power amplifier 720 is located at another position on a board of the electronic device and a corresponding second temperature sensor 721 is located adjacent to or on the second power amplifier 720. Since power amplifiers are freely positioned at any locations, the controller 110 can choose to activate one power amplifier existing in a location where a user can minimally feel a temperature of heat while executing a voice call, and deactivate the other power amplifier existing in a location where the user can maximally feel a temperature of heat.

It will be appreciated that the exemplary embodiments of the present disclosure can be implemented in a form of hardware, software, or a combination of hardware and software. Any such software can be stored, for example, in a volatile or non-volatile storage device such as a ROM, a memory such as a RAM, a memory chip, a memory device, or a memory IC, or a recordable optical or magnetic medium such as a CD, a DVD, a magnetic disk, or a magnetic tape, regardless of its ability to be erased or its ability to be re-recorded. It is appreciated that the storage unit included in the electronic device is one example of a program including commands for implementing various embodiments of the present disclosure or a machine-readable storage medium suitable for storing programs. Accordingly, the present disclosure includes a program that includes a code for implementing an apparatus or a method defined in any claim in the present specification and a machine-readable storage medium that stores such a program. Further, the program can be electronically transferred by a predetermined medium such as a communication signal transferred through a wired or wireless connection, and the present disclosure appropriately includes equivalents of the program.

Further, the electronic device can receive the program from a program providing apparatus connected to the device wirelessly or through a wire and store the received program. The program providing device can include a program including instructions allowing the electronic device to perform the method of controlling the screen, a memory for storing information required for the screen control method, a communication unit for performing wired or wireless communication with the electronic device, and a controller transmitting a corresponding program to the electronic device according to a request of the electronic device or automatically.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for operating an electronic device, the method comprising:
    amplifying a signal by a first power amplifier;
    obtaining a temperature of the first power amplifier during the amplification of the signal;
    comparing the temperature of the first power amplifier to a predetermined threshold value;
    switching the first power amplifier to a second power amplifier for amplifying the signal if the temperature of the first power amplifier is higher than the predetermined threshold value; and
    transmitting the amplified signal by using the switched second power amplifier,
    wherein the obtaining the temperature of the first power amplifier comprising measuring the temperature of the first power amplifier based on at least one of at least one operation mode and operation time of the first power amplifier, and
    wherein the temperature of the first power amplifier is measured by a first sensor that is located adjacent to the first power amplifier, and a temperature of the second power amplifier is measured by a second sensor that is located adjacent to the second power amplifier.

2. The method of claim 1, further comprising:
    causing the switch to switch the second power amplifier to the first power amplifier for amplifying the signal if a temperature of the second power amplifier is higher than the predetermined threshold value.

3. The method of claim 1, wherein the temperature of the first power amplifier or the second power amplifier is estimated based on its operation time.

4. The method of claim 3, wherein the first power amplifier and the second power amplifier are incorporated into one of a transceiving unit and a Front End Module Integrated Duplexer (FEMiD).

5. The method of claim 1, wherein the first power amplifier and the second power amplifier are located apart from each other so that one of the first power amplifier and the second power amplifier is not covered under a user's hand if the user grips the electronic device with the hand.

6. The method of claim 1, wherein the first power amplifier that is adjacent to a screen is deactivated, and the second power amplifier that is located on an opposite side of the screen is activate if a touch of a body part is sensed on the screen during a voice call.

7. The method of claim 1, wherein if a part of a user's body is sensed on the electronic device, adjusting the threshold value for a power amplifier that is closest to the part of a user's body.

8. The method of claim 1, wherein if a part of a user's body is sensed on the electronic device, a current power amplifier is switched to another power amplifier that is farther away from the part of the user's body.

9. An electronic device, comprising:
    a first power amplifier and a second power amplifier, each configured to amplify a signal;

a switch configured to switch between the first power amplifier and the second power amplifier for amplifying the signal; and a processor configured to:
cause the switch to let the first power amplifier to amplify the signal;
obtain a temperature of the first power amplifier during the amplification of the signal by a first sensor;
compare the temperature of the first power amplifier to a predetermined threshold value;
cause the switch to switch the first power amplifier to a second power amplifier for amplifying the signal if the temperature of the first power amplifier is higher than the predetermined threshold value; and
transmit the amplified signal by using the switched second power amplifier,
wherein the processor is further configured to measure the temperature of the first power amplifier based on at least one of at least one operation mode and operation time of the first power amplifier, and
wherein the temperature of the first power amplifier is measured by a first sensor that is located adjacent to the first power amplifier, and a temperature of the second power amplifier is measured by a second sensor that is located adjacent to the second power amplifier.

10. The electronic device of claim 9, wherein the processor is configured to cause the switch to switch the second power amplifier to the first power amplifier for amplifying the signal if a temperature of the second power amplifier is higher than the predetermined threshold value.

11. The electronic device of claim 9, wherein the processor is configured to estimate the temperature of the first power amplifier or the second power amplifier based on its operation time.

12. The electronic device of claim 9, wherein the first power amplifier and the second power amplifier are incorporated into one of a transceiving unit and a Front End Module Integrated Duplexer (FEMiD).

13. The electronic device of claim 9, wherein the first power amplifier and the second power amplifier are located apart from each other so that one of the first power amplifier and the second power amplifier is not covered under a user's hand if the user grips the electronic device with the hand.

14. The electronic device of claim 9, wherein the processor is configured to deactivate the first power amplifier that is adjacent to a screen, and activate the second power amplifier that is located on an opposite side of the screen if a touch of a body part is sensed on the screen during a voice call.

15. The electronic device of claim 9, wherein, if a part of a user's body is sensed on the electronic device, the processor is configured to adjust the threshold value for a power amplifier that is closest to the part of a user's body.

16. The electronic device of claim 9, wherein if a part of a user's body is sensed on the electronic device, the processor is configured to switch a current power amplifier to another power amplifier that is farther away from the part of the user's body.

* * * * *